United States Patent
Hattori et al.

(10) Patent No.: US 10,756,012 B2
(45) Date of Patent: Aug. 25, 2020

(54) CIRCUIT ASSEMBLY

(71) Applicants: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

(72) Inventors: Yuuichi Hattori, Mie (JP); Yoshikazu Sasaki, Mie (JP); Jun Ikeda, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi, Osaka (JP)

( * ) Notice: Subject to any disclaimer, the term of this patent is extended or adjusted under 35 U.S.C. 154(b) by 12 days.

(21) Appl. No.: 16/197,662

(22) Filed: Nov. 21, 2018

(65) Prior Publication Data
US 2019/0164878 A1    May 30, 2019

(30) Foreign Application Priority Data
Nov. 24, 2017   (JP) .................. 2017-225753

(51) Int. Cl.
*H01L 23/367* (2006.01)
*H01L 23/498* (2006.01)
(Continued)

(52) U.S. Cl.
CPC ........ *H01L 23/49844* (2013.01); *H01L 23/13* (2013.01); *H01L 23/367* (2013.01);
(Continued)

(58) Field of Classification Search
CPC . H01L 25/115; H01L 25/072; H01L 29/7397; H01L 23/492; H01L 23/053; H01L 23/051; H01L 2924/181; H01L 2224/32245; H01L 2224/33; H01L 2224/48091; H01L 23/3107; H01L 23/62; H01L 2924/00014; H01L 2924/00012; H01L 23/00; H01L 23/13; H01L 23/367; H01L 23/498; H01L 23/495; H01L 23/583; H01L 23/538; H01L 23/3672; H01L 23/49844; H01L 23/49861; H01L 23/49551; H01L 23/449575; H01L 23/552; H01L 23/49641; H01L 23/49541; H01L 23/49562; H01L 29/66; H01L 29/78;
(Continued)

(56) References Cited

U.S. PATENT DOCUMENTS

| | | | |
|---|---|---|---|
| 2003/0137813 A1 | 7/2003 | Onizuka et al. | |
| 2004/0160754 A1* | 8/2004 | Kobayashi | H05K 1/0203 361/783 |
| 2017/0365536 A1* | 12/2017 | Amo | H05K 7/20927 |

* cited by examiner

*Primary Examiner* — Chuong A Luu
(74) *Attorney, Agent, or Firm* — Honigman LLP (57) ABSTRACT

A circuit assembly is provided. The circuit assembly includes: a first bus bar and a second bus bar that are part of a power circuit; and a control board to which a control circuit configured to control current flow in the power circuit is mounted, the circuit assembly including: a semiconductor switching element including a drain terminal and a source terminal that are connected to the first bus bar and the second bus bar, respectively, and a gate terminal configured to receive input of a control signal from the control circuit configured to control current flow in the power circuit; and a third bus bar configured to electrically connect the gate terminal and the control board.

8 Claims, 6 Drawing Sheets

(51) Int. Cl.
*H05K 5/02* (2006.01)
*H01L 23/13* (2006.01)
*H05K 7/14* (2006.01)

(52) U.S. Cl.
CPC .... *H01L 23/3672* (2013.01); *H01L 23/49861* (2013.01); *H05K 5/0247* (2013.01); *H05K 7/1432* (2013.01)

(58) Field of Classification Search
CPC .............. H01L 29/739; H01L 29/7393; H01L 29/7805; H01L 29/7813; H01L 29/66348
USPC ........................................................ 257/675
See application file for complete search history.

CIRCUIT ASSEMBLY

CROSS-REFERENCE TO RELATED APPLICATIONS

This application claims priority of Japanese Patent Application No. JP 2017-225753 filed Nov. 24, 2017.

TECHNICAL FIELD

The present disclosure relates to a circuit assembly.

BACKGROUND

Circuit assemblies are generally known in which a conductive member (also called a "bus bar" or the like) that is a part of a circuit for conducting a relatively large current is fixed to a board on which a conductive pattern forming a circuit for conducting a relatively small current is formed (see e.g. JP 2003-164039A).

SUMMARY

When mounting a semiconductor element onto a conventional circuit assembly, it is necessary to solder-connect a drain terminal and a source terminal of an FET (field-effect transistor) to a bus bar, and also to bend gate terminal to connect it to a board provided on the upper surface side of the bus bar. For conventional circuit assemblies, the bus bar needs to be attached to the board, and the gate terminal needs to be bent, resulting in the problem of an increase in the manufacturing costs.

In conventional circuit assemblies, as heat resistance measures for a board control portion, a control board on which electronic components having a relatively low heat-resistant temperature and a control board on which electronic components having a relatively high heat-resistant temperature are mounted are prepared separately, and these control boards are connected using an inter-board connector. The connection using the inter-board connector also results in an increase in the manufacturing costs.

It is an object of the present disclosure to provide a circuit assembly that can keep down the manufacturing costs.

A circuit assembly according to an aspect of the present disclosure is a circuit assembly including: a first bus bar and a second bus bar that are part of a power circuit; and a control board to which a control circuit configured to control current flow in the power circuit is mounted, the circuit assembly including: a semiconductor switching element including a drain terminal and a source terminal that are connected to the first bus bar and the second bus bar, respectively, and a gate terminal configured to receive input of a control signal from the control circuit configured to control current flow in the power circuit; and a third bus bar configured to electrically connect the gate terminal and the control board.

With the above-described configuration, it is possible to keep down the manufacturing costs.

DETAILED DESCRIPTION OF PREFERRED EMBODIMENTS

Aspects of the present disclosure will be listed and described below. At least some of the aspects described below may be combined freely.

A circuit assembly according to an aspect of the present disclosure is a circuit assembly including: a first bus bar and a second bus bar that are part of a power circuit; and a control board to which a control circuit configured to control current flow in the power circuit is mounted, the circuit assembly including: a semiconductor switching element including a drain terminal and a source terminal that are connected to the first bus bar and the second bus bar, respectively, and a gate terminal configured to receive input of a control signal from the control circuit configured to control current flow in the power circuit; and a third bus bar configured to electrically connect the gate terminal and the control board.

According to this aspect, the semiconductor switching element can be connected to the control board by using the third bus bar connected to the gate terminal, and it is thus possible to eliminate the use of components such as an inter-board connector, making it possible to avoid an increase in the manufacturing costs.

In a circuit assembly according to another aspect of the present disclosure, the first bus bar, the second bus bar, and the third bus bar are plate members, and the first bus bar and the second bus bar have a thickness that is set to be larger than a thickness of the third bus bar.

According to this aspect, the thicknesses of the first bus bar and the second bus bar are set to be larger than the thickness of the third bus bar, and it is thus possible to accommodate a large current flowing between a power supply, such as a battery, included in a vehicle, and a load including a vehicle-mounted electric/electronic component such as a lamp and a wiper or a motor or the like.

In a circuit assembly according to another aspect of the present disclosure, the first bus bar, the second bus bar, and the third bus bar are part of a composite molded article molded in one piece using an insulating resin molded article, the composite molded article has an exposed surface on which part of the first bus bar, the second bus bar, the third bus bar, and the resin molded article is exposed, and the first bus bar, the second bus bar, the third bus bar, and the resin molded article are flush with each other on the exposed surface.

According to this aspect, the exposed surface of the composite molded article is formed to be flush, no unnecessary projection is present on the exposed surface. Accordingly, for example, a solder paste can be uniformly applied when printing the solder paste during reflowing, making it possible to favorably join the terminals of the semiconductor switching element to the bus bars.

Since the upper surface of the terminal connection portion is present in the same plane as the upper surfaces of the first bus bar and the second bus bar, it is not necessary to perform bending processing when connecting the gate terminal to the third bus bar, making it possible to avoid an increase in the processing costs.

In a circuit assembly according to another aspect of the present disclosure, the third bus bar includes: a terminal connection portion that forms a portion of the exposed surface and is connected to the gate terminal; and a board connection portion that is bent from one end of the terminal connection portion and is connected to the control board.

According to this aspect, the semiconductor switching element can be connected to the control board by using the board connection portion that is bent from one end of the terminal connection portion for the gate terminal, and it is thus possible to eliminate the use of components such as an inter-board connector, making it possible to avoid an increase in the manufacturing costs.

In a circuit assembly according to another aspect of the present disclosure, the semiconductor switching element is mounted on the exposed surface.

According to this aspect, the semiconductor switching element is mounted on the exposed surface that is formed to be flush, and it is therefore not necessary to perform bending processing when connecting the gate terminal to the third bus bar, making it possible to avoid an increase in the processing costs.

A circuit assembly according to another aspect of the present disclosure includes a heat dissipation portion provided opposing the exposed surface.

According to this aspect, it is possible to allow the heat generated in the semiconductor switching element and the like to escape to the outside through the heat dissipation portion.

Hereinafter, the present disclosure will be described in detail with reference to the drawings illustrating embodiments thereof.

Embodiment 1

Figure 1:
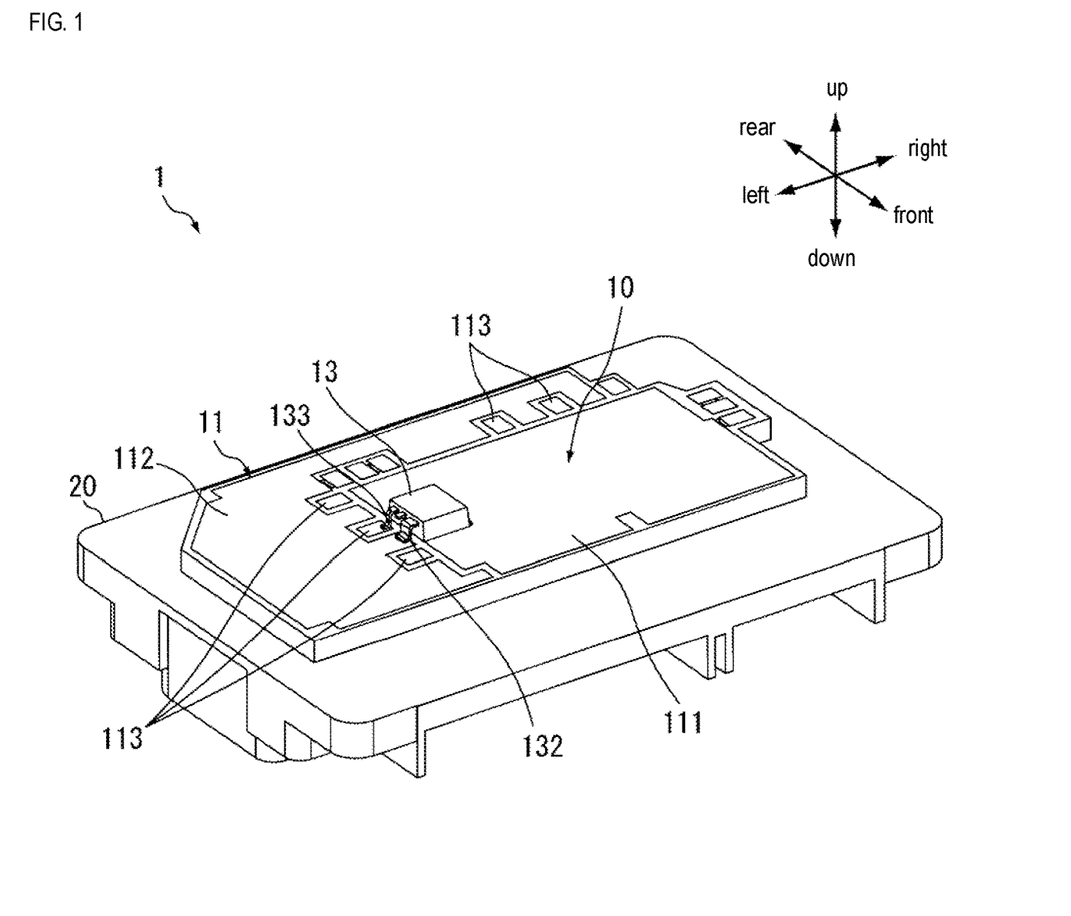
FIG. 1 is a perspective view of a circuit assembly according to Embodiment 1.
Figure 2:
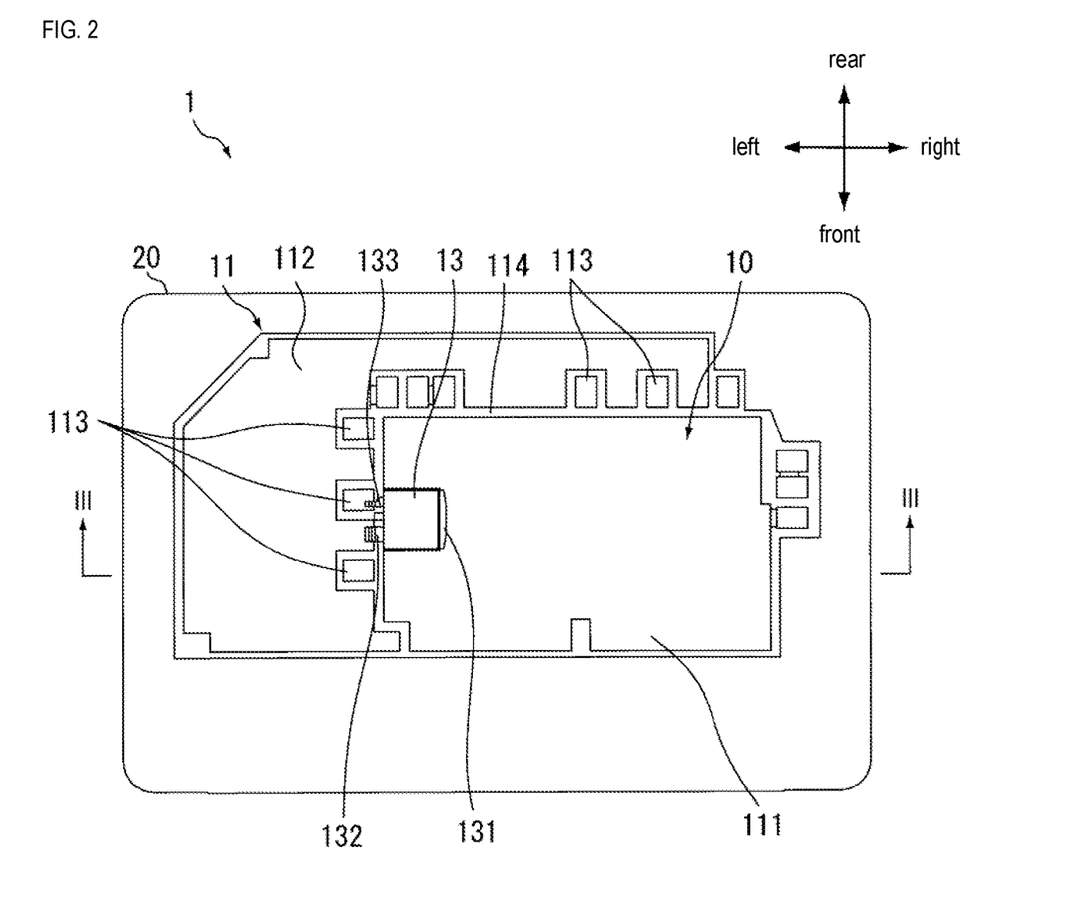
FIG. 2 is a plan view of the circuit assembly according to Embodiment 1.
Figure 3:
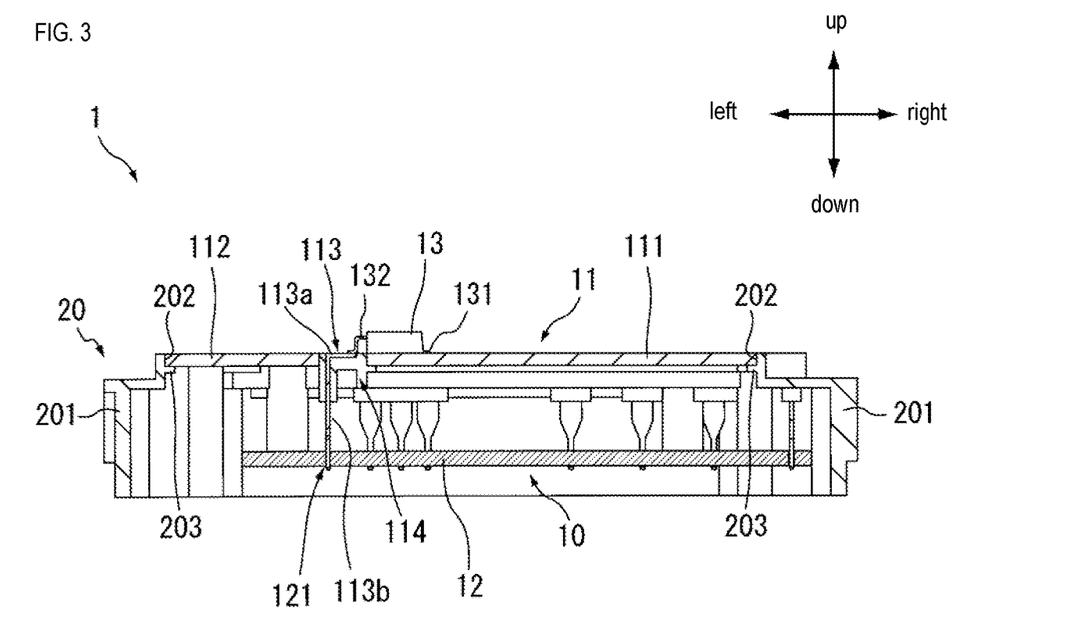
FIG. 3 is a cross-sectional view taken along the line III-III in FIG. 2.

FIG. 1 is a perspective view of a circuit assembly 1 according to Embodiment 1, FIG. 2 is a plan view thereof, and FIG. 3 is a cross-sectional view taken along the line III-III in FIG. 2. The circuit assembly 1 is part of an electrical junction box that is disposed on a power supply path between a power supply, such as a battery, included in a vehicle, and a load including a vehicle-mounted electric/electronic component such as a lamp or a wiper, or a motor or the like. The circuit assembly 1 can be used, for example, as an electric component such as a DC-DC converter or an inverter.

In Embodiment 1, "front", "rear", "left", "right", "up", and "down" of the circuit assembly 1 are defined respectively by the front, rear, left, right, up, and down directions shown in FIGS. 1 to 3. In the following, the configuration of the circuit assembly 1 will be described using the front-right, left-right, and up-down directions defined in FIGS. 1 to 3. Note that the front-rear, left-right, and up-down directions in FIGS. 1 to 3 are illustrated for convenience, and do not necessarily represent the front-rear, left-right, and up-down directions in a state in which the circuit assembly 1 is attached to an attaching portion of a vehicle or the like.

The circuit assembly 1 is made up of a circuit portion 10 and a housing portion 20 that houses the circuit portion 10. The circuit portion 10 includes bus bars that are part of a power circuit, a control board 12 on which a control circuit that controls current flow in the power circuit is mounted, and a semiconductor switching element 13 that receives input of a control signal from the control board 12 that controls current flow in the power circuit including the bus bars, and switches between current flow/no current flow based on the input control signal. The semiconductor switching element 13 may be, for example, an FET (more specifically, a surface-mounted power MOSFET), and is mounted on the bus bars. In addition to the semiconductor switching element 13, an electronic component such as a Zener diode may be mounted on the bus bars.

For the sake of simplicity, the example in FIGS. 1 to 3 shows a configuration in which only one semiconductor switching element 13 is mounted. However, it is, of course, also possible to mount a plurality of semiconductor switching elements 13.

The semiconductor switching element 13 (hereinafter referred to as "FET 13") includes a drain terminal 131 on the right side surface of the element body, and a source terminal 132 and a gate terminal 133 on the left side surface of the element body. The drain terminal 131 of the FET 13 is solder-connected to a bus bar 111 (hereinafter referred to as "drain bus bar 111") that is disposed in a region occupying the major portion, on the right side, of an exposed region of the upper surface of the circuit portion 10. The source terminal 132 of the FET 13 is solder-connected to a bus bar 112 (hereinafter referred to as "source bus bar 112") disposed in a region occupying the major portion, on the left and rear sides, of the exposed region of the upper surface of the circuit portion 10. The drain bus bar 111 and the source bus bar 112 are conductive plate members made of a metal material such as copper or a copper alloy, and have a thickness of about 1.5 to 2.0 mm, for example.

Meanwhile, the gate terminal 133 of the FET 13 is solder-connected to bus bars 113 (hereinafter referred to as "gate bus bars"113) disposed spaced apart from each other between the drain bus bar 111 and the source bus bar 112. In the illustrated example, three gate bus bars 113 are provided along the left side of the drain bus bar 111, and two gate bus bars 113 are provided along the upper side thereof. Each gate bus bar 113 is a conductive plate member made of a metal material such as copper or a copper alloy, and has a thickness of about 0.64 mm, for example.

Unlike the drain bus bar 111 and the source bus bar 112, the gate bus bars 113 are exposed on the upper surface of the circuit portion 10, and have a three-dimensional structure including a terminal connection portion 113*a* that is connected to the gate terminal 133, and a board connection portion 113*b* that is bent downward from one end of the terminal connection portion 113*a* and is connected to the control board 12. The board connection portion 113*b* has, in side view, a tapered shape that is narrower at its lower end than at its upper end. In the present embodiment, the gate bus bar 113 is electrically connected to the control board 12 by passing the lower end of the board connection portion 113*b* through a through hole 121 formed in the control board 12, and filling the through hole 121 with a conductive material. Note that the length of the board connection portion 113*b* in the up-down direction may be designed as appropriate according to the specification or the required heat resistance performance of the circuit assembly 1, for example.

The drain bus bar 111, the source bus bar 112, and the gate bus bars 113 are part of a composite molded article 11 molded in one piece using an insulating resin material. Such a composite molded article 11 can be produced, for example, by insert molding with an insulating resin material such as a phenol resin or a glass epoxy resin. A resin molded article 114 molded using the insulating resin material integrates the bus bars in one piece by being joined with the bus bars, and also achieves insulation between the bus bars by being disposed between the bus bars. In the present embodiment, the composite molded article 11 is molded through insert molding such that the drain bus bar 111, the source bus bar 112, the terminal connection portions 113a of the gate bus bars 113, and the exposed surface (the upper surface in the illustrated example) of the resin molded article 114 are flush with each other.

The control board 12 includes a rectangular insulating substrate, for example. On the lower surface of the insulating substrate, a control circuit (not shown) including electronic components including, for example, a switching element such as an FET, a resistor, a coil, a capacitor, and a diode is mounted, and a wiring pattern (not shown) that electrically connects these electronic components is formed. A through hole 121 through which the lower end of the board connection portion 113b included in each gate bus bar 113 is passed is formed in the control board 12. Electrical conduction between the FET 13 mounted on the upper surface of the circuit assembly 1 and the control circuit mounted on the lower surface of the control board 12 is ensured by passing the lower ends of the gate bus bars 113 through the through holes 121 of the control board 12, and filling the through holes 121 with the conductive material to achieve connection to the wiring pattern.

The housing portion 20 is a resin case whose upper side and lower side are open. The housing portion 20 includes a circumferential wall portion 201 that surrounds the circumferential edges, in the left-right direction and the front-rear direction, of the composite molded article 11 and the control board 12 that are housed therein. An opening portion that is formed to be slightly larger than the circumferential edges of the composite molded article 11 in the left-right direction and the front-rear direction is provided at the upper end of the circumferential wall portion 201. A rib 203 protruding inward is formed on an inner circumferential surface of the circumferential wall portion 201 in the vicinity of the upper end. By supporting the circumferential edge portion of the composite molded article 11 from the lower surface side by the rib 203 formed on the inner circumferential surface of the circumferential wall, the housing portion 20 can house therein the circuit portion 10 in which the composite molded article 11 and the control board 12 are integrated with each other.

Preferably, the housing portion 20 and the composite molded article 11 are fixed together using a known method such as screwing or bonding. Preferably, the upper end face of the housing portion 20 is flush with the exposed surface of the composite molded article 11, or is formed to be lower than the exposed surface of the composite molded article 11.

Figure 4:
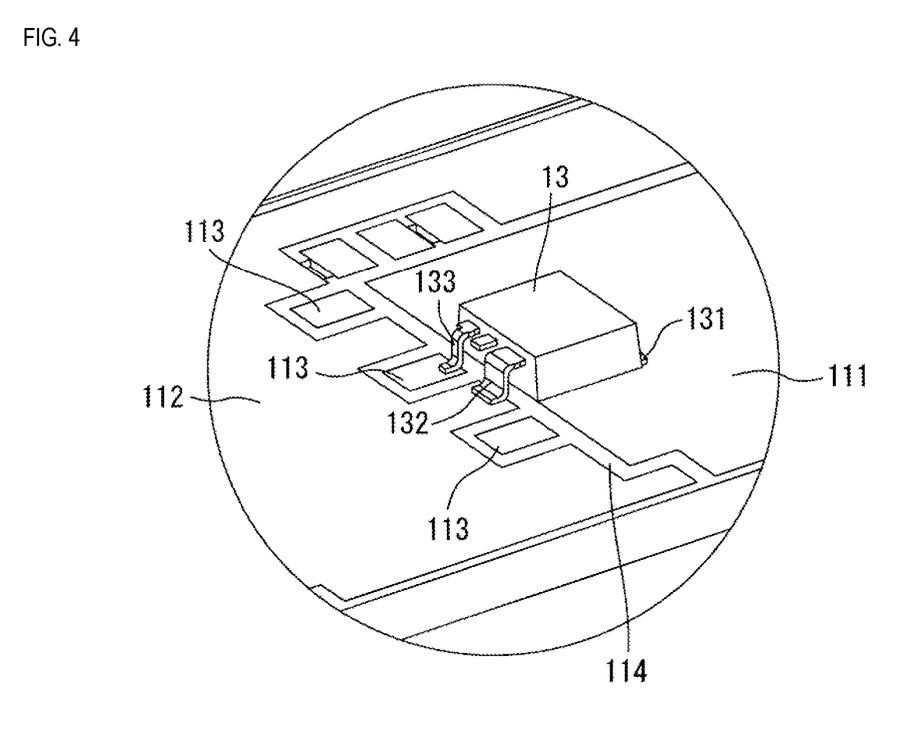
FIG. 4 is a partial enlarged view illustrating a mounting state of an FET.
Figure 5:
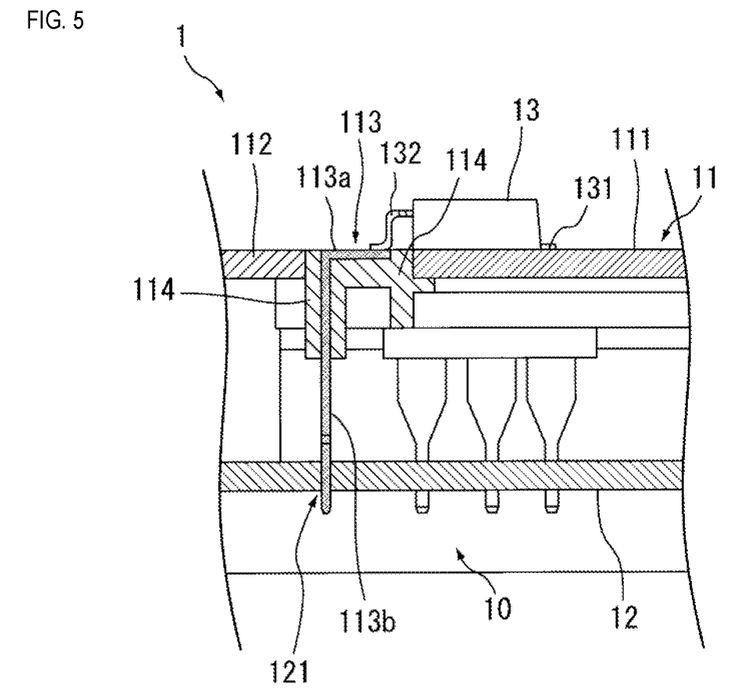
FIG. 5 is a vertical cross-sectional view illustrating the mounting state of the FET.

FIG. 4 is a partial enlarged view illustrating a mounting state of the FET 13, and FIG. 5 is a vertical cross-sectional view thereof. The FET 13 is mounted onto the exposed surface of the composite molded article 11, for example, by using the reflow method. In the reflow method, a solder paste is printed on a joining location on the board, using a mask having an opening provided in the portion corresponding to the joining location on the board, and, after an electronic component is placed on the board, the solder is melted to join the electronic component to the joining location on the board. In the present embodiment, the exposed surface of the composite molded article 11 is formed to be flush, and no unnecessary projection is present on the exposed surface. Accordingly, when printing the solder paste, the solder paste can be uniformly applied, making it possible to favorably join the terminals of the FET 13 to the bus bars.

In the present embodiment, the FET 13 is placed on the drain bus bar 111, the drain terminal 131 is joined to the drain bus bar 111, and the gate terminal 133 and the source terminal 132 are joined to the gate bus bars 113 and the source bus bar 112, respectively, straddling the resin molded article 114. Since the upper surfaces of the terminal connection portions 113a of the gate bus bars 113 are located in the same plane as the upper surfaces of the drain bus bar 111 and the source bus bar 112, it is not necessary to perform bending processing when connecting the gate terminal 133 to the gate bus bars 113, making it possible to avoid an increase in the processing costs.

In the present embodiment, as shown in FIG. 5, the FET 13 can be connected to the control board 12 by using the board connection portion 113b provided bending from one end of the terminal connection portion 113a of the gate terminal 133, and it is therefore possible to eliminate the use of components such as an inter-board connector, making it possible to avoid an increase in the manufacturing costs.

In the present embodiment, the thicknesses (e.g., 1.5 to 2.0 mm) of the source bus bar 112 and the drain bus bar 111 are set to be larger than the thickness (e.g., 0.64 mm) of the gate bus bars 113, and it is thus possible to accommodate a large current flowing between a power supply, such as a battery, included in a vehicle, and a load including a vehicle-mounted electric/electronic component such as a lamp or a wiper, or a motor.

Embodiment 2

In Embodiment 2, a configuration including a heat dissipation portion will be described.

Figure 6:
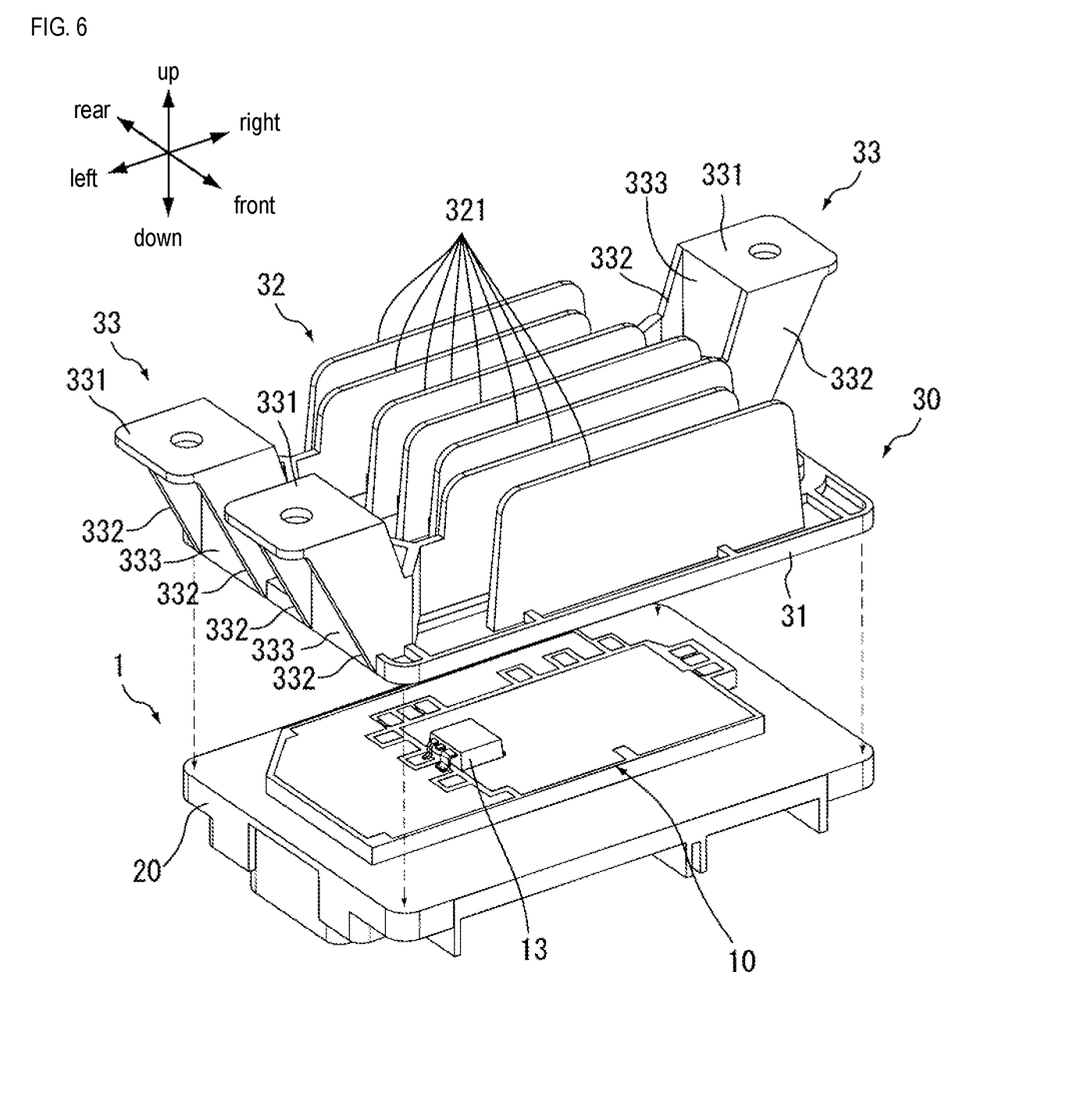
FIG. 6 is an assembly diagram of a circuit assembly according to Embodiment 2.
Figure 7:
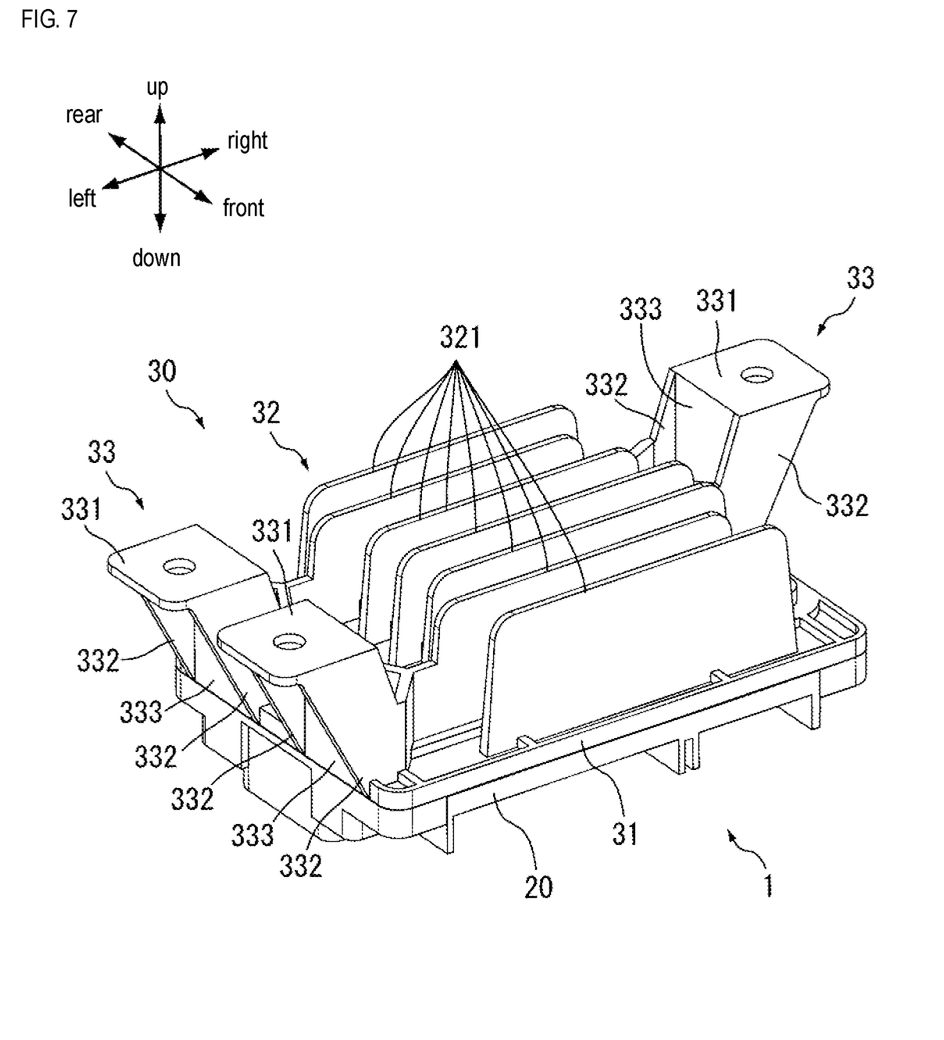
FIG. 7 is a perspective view of the circuit assembly according to Embodiment 2.

FIG. 6 is an assembly diagram of a circuit assembly 1 according to Embodiment 2, and FIG. 7 is a perspective view thereof. In Embodiment 2, a supporting member 30 is attached onto the upper surface of a housing portion 20. The supporting member 30 includes a base portion 31, a heat dissipation portion 32 provided on the upper surface of the base portion 31, and leg portions 33 provided at left and right ends of the base portion 31 across the heat dissipation portion 32. The base portion 31, the heat dissipation portion 32, and the leg portions 33 that are included in the supporting member 30 are molded in one piece, for example, by die casting a metal material such as aluminum or an aluminum alloy. The base portion 31 of the supporting member 30 is fixed to the housing portion 20 of the circuit assembly 1 by a known method such as bonding, screwing, or soldering.

The heat dissipation portion 32 includes a plurality of heat dissipation fins 321 protruding upward from the upper surface of the base portion 31, and dissipate the heat generated from the circuit assembly 1 to the outside. A plurality of heat dissipation fins 321 are provided extending in the left-right direction and spaced apart from each other in the front-rear direction. The cross-sectional shape of each heat dissipation fin 321 in the thickness direction may be for example, a chevron shape elongated in the up-down direction and having a tapered upper end portion.

The leg portions 33 are provided at the left and right ends of the base portion 31. In the present embodiment, two leg portions 33 are provided on the left side of the base portion 31 and one leg portion 33 is provided on the right side thereof. Each leg portion 33 includes an attachment plate 331 that is disposed substantially horizontally and is attached to an attaching portion of a vehicle or the like, and a pair of front and rear side plates 332 that connect the attachment plate 331 and the upper surface of the base portion 31 with each other. The leg portion 33 includes a reinforcing plate 333 that is disposed crossing the side plates 332 and is continuous with both the attachment plate 331 and the side plates 332. Preferably, the leg portions 33 are formed extending above the protruding height of the heat dissipation portion 32.

The circuit assembly 1 to which the supporting member 30 has been attached is attached to the attaching portion such that the direction of extension of the heat dissipation fins 321 is in a substantially vertical direction. When the circuit assembly 1 is attached in this manner, the heat generated from the circuit portion 10 is dissipated by the heat dissipation fins 321, and the air heated by the heat dissipated from the heat dissipation fins 321 flows vertically above through the spaces between the heat dissipation fins 321, and is guided to the outside of the circuit assembly 1. Thus, the circuit assembly 1 according to the present embodiment allows the heat generated in the circuit portion 10 to escape to the outside through the spaces between the heat dissipation fins 321.

It should be appreciated that the embodiments disclosed herein are to be construed in all respects as illustrative and not limiting. The scope of the present disclosure is defined by the claims, rather than the description of the embodiment above, and is intended to include all modifications which fall within the scope of the claims and the meaning and scope of equivalents thereof.

What is claimed is:

1. A circuit assembly comprising:
a first bus bar and a second bus bar that are part of a power circuit;
a control board to which a control circuit configured to control current flow in the power circuit is mounted, and
a semiconductor switching element including a drain terminal and a source terminal that are connected to the first bus bar and the second bus bar, respectively, and a gate terminal configured to receive input of a control signal from the control circuit configured to control current flow in the power circuit; and
a third bus bar configured to electrically connect the gate terminal and the control board, wherein the first bus bar, the second bus bar, and the third bus bar are plate members, and the first bus bar and the second bus bar have a thickness that is set to be larger than a thickness of the third bus bar.

2. The circuit assembly according to claim 1, wherein the first bus bar, the second bus bar, and the third bus bar are part of a composite molded article that is molded in one piece using an insulating resin molded article,
the composite molded article has an exposed surface on which part of the first bus bar, the second bus bar, the third bus bar, and the resin molded article is exposed, and
the first bus bar, the second bus bar, the third bus bar, and the resin molded article are flush with each other on the exposed surface.

3. The circuit assembly according to claim 2, wherein the third bus bar includes:
a terminal connection portion that forms a portion of the exposed surface and is connected to the gate terminal; and
a board connection portion that is bent from one end of the terminal connection portion and is connected to the control board.

4. The circuit assembly according to claim 2, wherein the semiconductor switching element is mounted on the exposed surface.

5. The circuit assembly according to claim 2, further comprising a heat dissipation portion provided opposing the exposed surface.

6. The circuit assembly according to claim 3, wherein the semiconductor switching element is mounted on the exposed surface.

7. The circuit assembly according to claim 3, further comprising a heat dissipation portion provided opposing the exposed surface.

8. The circuit assembly according to claim 4, further comprising a heat dissipation portion provided opposing the exposed surface.

* * * * *